United States Patent
Vashchenko et al.

(10) Patent No.: US 7,115,951 B1
(45) Date of Patent: Oct. 3, 2006

(54) LOW TRIGGERING VOLTAGE ESD PROTECTION STRUCTURE AND METHOD FOR REDUCING THE TRIGGERING VOLTAGE

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US); Yuri Mirgorodsky, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 213 days.

(21) Appl. No.: 10/234,817

(22) Filed: Sep. 4, 2002

(51) Int. Cl.
*H01L 23/62* (2006.01)

(52) U.S. Cl. .................... 257/355; 257/356; 257/362

(58) Field of Classification Search ........ 257/355–358, 257/359, 360–362, 363, 341, 342, 173, 174, 257/758; 438/309
See application file for complete search history.

(56) References Cited

U.S. PATENT DOCUMENTS

| 4,102,714 | A | * | 7/1978 | DeBar et al. | ............... 438/237 |
| 5,949,094 | A | * | 9/1999 | Amerasekera | .............. 257/173 |
| 6,388,292 | B1 | * | 5/2002 | Lin | ............................ 257/356 |
| 6,593,157 | B1 | * | 7/2003 | Chen et al. | ................... 438/18 |
| 6,605,493 | B1 | * | 8/2003 | Yu | .............................. 438/135 |

FOREIGN PATENT DOCUMENTS

JP          1-251663       * 10/1989    ................... 29/78

* cited by examiner

*Primary Examiner*—Hung Vu
(74) *Attorney, Agent, or Firm*—Jurgen Vollrath

(57) ABSTRACT

In a triggering ESD protection structure, the triggering voltage is reduced by introducing one or more corners or spikes into the p-n breakdown junction. This may be done by providing a polygate with a zig-zag pattern to define triangular corners in the drain or anode of the structure.

6 Claims, 2 Drawing Sheets

LOW TRIGGERING VOLTAGE ESD PROTECTION STRUCTURE AND METHOD FOR REDUCING THE TRIGGERING VOLTAGE

FIELD OF THE INVENTION

The invention relates to the field of ESD protection structures and to a way of reducing the triggering voltage in such a structure.

BACKGROUND OF THE INVENTION

The functional parameters of any ESD protection snapback structure, such as a GGNMOS, LVTSCR, NPN-BJT has to fit within a so-called ESD protection window. The triggering voltage of the ESD structure has to be lower than the primary breakdown voltage of the device(s) it is protecting, but it has to have a holding voltage that exceeds the normal operating voltage of the protected devices, to avoid latch-up. However, the internal circuit that is being protected typically has a similar breakdown voltage as the ESD structure, and often tends to breakdown before the triggering voltage of the ESD protection structure is reached. The backend resistance further exacerbates this problem since it provides an additional voltage drop, thereby exposing the internal circuit to an increased voltage comprising the breakdown voltage plus the additional voltage drop across the backend resistance.

Some attempts at resolving this problem include using different dynamic driver circuits to help in triggering the ESD structure. This is not always suitable because the electrode for realizing such a dynamic driver circuit may be missing, or space constraints may make the additional circuitry undesirable. Another approach involves the use of ESD implants to reduce the triggering voltage by reducing the number of carriers that are diverted into the substrate. However this requires additional process steps, making the solution more expensive to implement.

It is also desirable that a solution involve typical process steps and avoid any additional process steps.

SUMMARY OF THE INVENTION

The present invention provides a method of reducing the triggering voltage in an ESD protection structure that makes use of p-n junction breakdown, comprising defining angled corners on the drain or anode region. The angled corners are preferably acute angles and may define one or more triangular or zig-zag shapes with points defining the p-n junction. The ESD structure may be any p-n junction breakdown device such as BiCMOS, LVTSCR, BJT, or GGNMOS.

According to the invention, there is provided an ESD protection structure defining a p-n junction between a drain, collector or anode, and a region of opposite polarity, wherein the drain, collector, or anode defines at least one pointed extension extending into the region of opposite polarity. The at least one pointed extension may comprise at least one acute angled corner. The drain, collector, or anode may define multiple needle-like regions.

Further according to the invention, there is provided an ESD protection structure having a doped region of a first polarity connected to a positive terminal and forming a p-n junction with a region of opposite polarity, wherein the p-n junction defines a non-linear pattern. The non-linear pattern my comprise a zig-zag pattern defining one or more corners. The doped region of the first polarity may define one or more needle-like protrusion. The ESD structure may be a BiCMOS, LVTSCR, BJT, or GGNMOS.

Still further, according to the invention, there is provided a method of reducing the breakdown voltage of an ESD structure comprising forming a polygate with a non-linear shape to define protrusions in a region of a first polarity connected to the positive terminal. The non-linear shape may be a zig-zag pattern defining at least one corner. The at least one corner is preferably an acute angled corner.

BRIEF DESCRIPTION OF THE DRAWINGS

FIG. 3 shows I–V curves for the structures of FIGS. 1 and 3, and

DETAILED DESCRIPTION OF THE INVENTION

Figure 1:
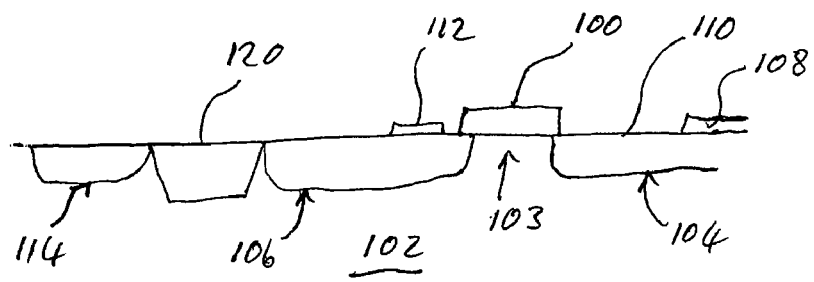
FIG. 1 is a sectional side view through a prior art NMOS structure.
Figure 2:
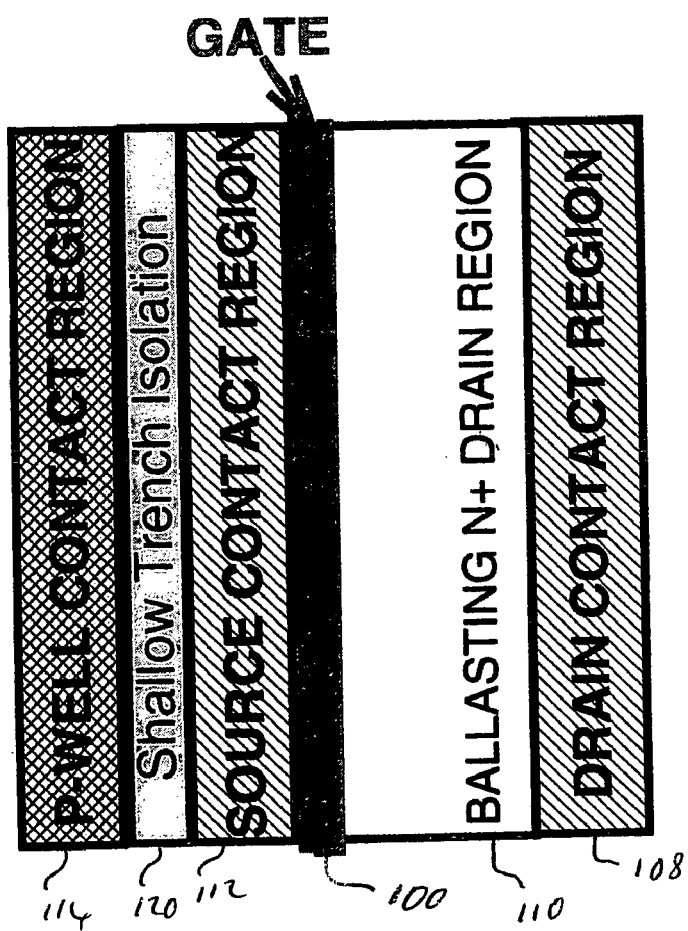
FIG. 2 is a plan view of the structure of FIG. 1.

FIGS. 1 and 2 show a prior art NMOS device comprising a polygate 100 formed over a substrate 102 to define a channel 103 (FIG. 1) and acting as a self-aligned mask for forming the drain region 104 and source region 106. Drain contact 108 connects to a n+ drain ballast region 110. The source contact 112, in turn, connects to the source region 106. The device further includes a p-well contact 114 providing a contact to the p-substrate of p-well 102. The p-well contact 114 is isolated from the source region 106 by a shallow trench isolation region 120. As is evident from the plan view in FIG. 2, the conventional NMOS device defines a linear polygate. Since this defines the shape of the drain region 104 (FIG. 2), the drain region 104 will also be linear in nature.

The present invention provides for angles or protrusions from the drain region, in order to increase the electric field at the p-n junction between the drain and the well or substrate 102. This increased electric field at the p-n junction ensures lower voltage breakdown of the junction and therefore lower triggering voltage for the device.

Figure 3:
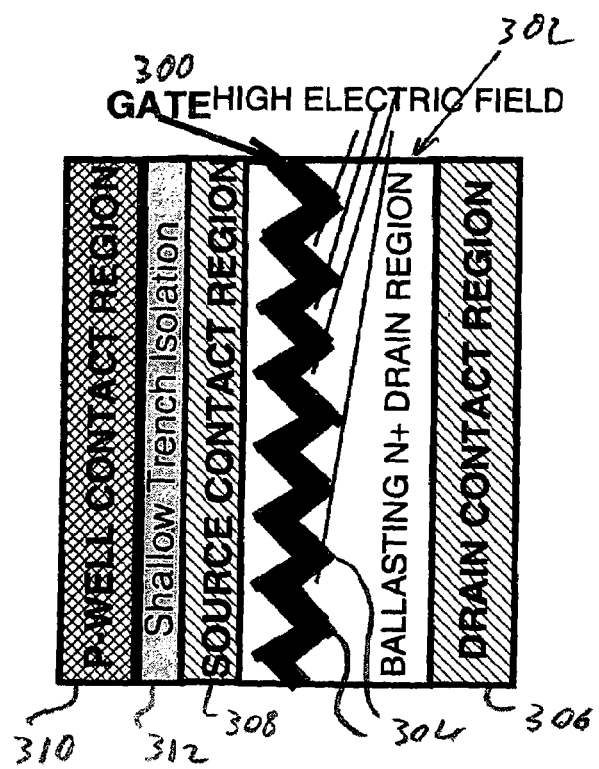
FIG. 3 is a plan view of one embodiment of a NMOS structure of the invention.

One such embodiment of the invention is shown in FIG. 3, which shows a plan view of a NMOS device of the invention. In this embodiment the polygate 300 defines a zig-zag pattern and therefore also provides a drain region 302 having a plurality of corners 304 or triangular points. Also shown in FIG. 3 is a drain contact region 306 to a drain ballast of the drain region 302, a source contact region 308, and a p-well contact region 310 separated from the source contact region 308 by a shallow trench isolation region 312.

Figure 4:
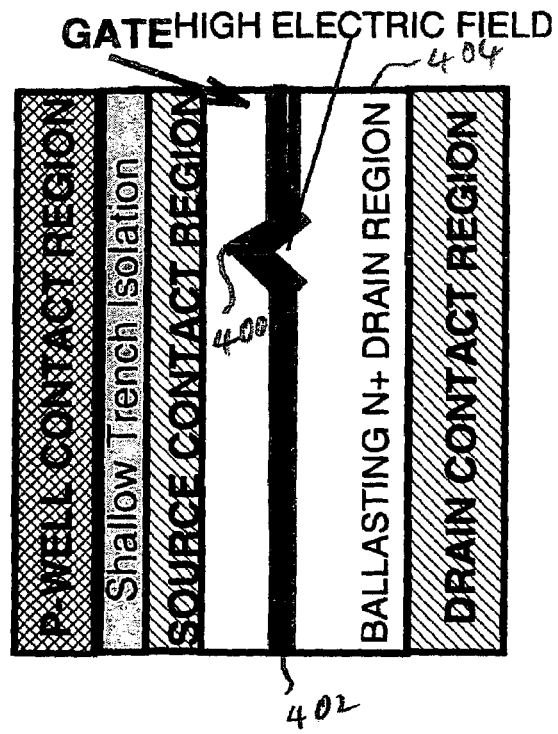
FIG. 4 shows a plan view of another embodiment of a NMOS structure of the invention.

It will be appreciated that sharper corners to the drain region will result in larger electric fields at the corners. Thus the angles of the corners are preferably acute angles. Furthermore, while a plurality of corners in the form of a zig-zag pattern is shown in the embodiment of FIG. 3, other embodiments can be provided in accordance with the invention. In FIG. 4, for example, a single corner 400 is provided to the gate 402, to define a drain region 404 with a single corner. Instead of a zig-zag pattern to the gate, forming one or more corners in the drain region, the gate may be formed with triangular indentations toward the drain or anode side. Instead, the drain region may be formed with spikes or protrusions extending toward the channel under the gate.

One benefit contemplated from the use of one or more triangular points or corners as shown in FIGS. 3 and 4 is an enlarge n+ ballast area extending away from the gate region toward the drain contact to help with current spreading and thus better current saturation and resistance to hot-spot overload.

While the invention was described above mainly with respect to NMOS structures, the invention also applies to other structures having a p-n junction which relies on junction breakdown to trigger, for example SCRs, LVTSCRs, NPN BJT's, Triacs, Thyristors. It will be appreciated that in the case of BJT's, the invention will typically be implemented only insofar as a substantially vertically extending p-n junction is defined between the n-collector and p-material in which it is formed.

It will, further, be appreciated that in practice any spikes or corners formed in the drain or anode region will have a somewhat rounded shape. However, the radius of the rounded corners is preferably kept small to define essentially a corner that provides an elevated electric field across its junction.

As will be clear from the above discussions, the embodiments discussed are only some implementations of the invention and other configurations can be provided without departing from the scope of the invention.

What is claimed is:

1. An ESD protection structure comprising
a drain, collector, or anode,
a source, emitter or cathode, and
a gate, the protection structure defining a p-n breakdown junction between the drain, collector or anode, and a region of opposite polarity, wherein the gate, when viewed in plan view, defines a zig-zag pattern that includes multiple sharp-cornered indentations and extensions to define multiple complementary sharp-cornered extensions and indentations in the drain, collector, or anode.

2. An ESD protection structure of claim 1, wherein the multiple sharp-cornered extensions and indentations of the drain collector or anode comprise acute angled corners.

3. An ESD protection structure of claim 1, wherein the drain, collector, or anode defines multiple needle-like extensions.

4. An ESD protection structure having a doped region of a first polarity connected to a positive terminal and forming a p-n junction with a region of opposite polarity, wherein the p-n junction defines a zig-zag pattern that includes multiple sharp-cornered indentations and extensions when viewed in plan view.

5. An ESD protection structure of claim 4, wherein the doped region of the first polarity defines multiple needle-like protrusions.

6. An ESD protection structure of claim 4, wherein the ESD structure is a SCR, LVTSCR, BJT, or GGNMOS device.

* * * * *